US012670968B2

(12) United States Patent
Wu et al.

(10) Patent No.: US 12,670,968 B2
(45) Date of Patent: Jun. 30, 2026

(54) METHOD AND APPARATUS FOR MEMORY TESTING

(71) Applicant: Winbond Electronics Corp., Taichung (TW)

(72) Inventors: Chien-Min Wu, Taichung City (TW); Shao-Ching Liao, Taichung City (TW); Kuang-Chih Hsieh, Taichung City (TW)

(73) Assignee: Winbound Electronics Corp., Taichung City (TW)

( * ) Notice: Subject to any disclaimer, the term of this patent is extended or adjusted under 35 U.S.C. 154(b) by 141 days.

(21) Appl. No.: 18/898,662

(22) Filed: Sep. 26, 2024

(65) Prior Publication Data

US 2026/0018232 A1 Jan. 15, 2026

(30) Foreign Application Priority Data

Jul. 11, 2024 (TW) ................................. 113126074

(51) Int. Cl.
*G11C 29/46* (2006.01)
*G11C 29/12* (2006.01)
*G11C 29/38* (2006.01)

(52) U.S. Cl.
CPC ........ *G11C 29/46* (2013.01); *G11C 29/12005* (2013.01); *G11C 29/38* (2013.01)

(58) Field of Classification Search
CPC ... G11C 29/46; G11C 29/12005; G11C 29/38; G11C 29/006

USPC .......................................................... 365/201
See application file for complete search history.

(56) References Cited

U.S. PATENT DOCUMENTS

| | | | | |
|---|---|---|---|---|
| 6,728,910 B1 * | 4/2004 | Huang | ................... | G11C 29/16 |
| | | | | 365/201 |
| 2006/0085604 A1 * | 4/2006 | Guthrie | ................. | G06F 9/3834 |
| | | | | 711/E12.024 |
| 2009/0059698 A1 * | 3/2009 | Chang | ................... | G11C 29/08 |
| | | | | 365/201 |
| 2010/0125766 A1 * | 5/2010 | Anzou | ................... | G11C 29/14 |
| | | | | 714/719 |
| 2011/0161590 A1 * | 6/2011 | Guthrie | ............... | G06F 12/0811 |
| | | | | 711/144 |
| 2024/0282397 A1 | 8/2024 | Liao et al. | | |

* cited by examiner

*Primary Examiner* — Fernando Hidalgo
(74) *Attorney, Agent, or Firm* — JCIPRNET

(57) ABSTRACT

A method and an apparatus for memory testing are provided. The method includes following steps: after multiple dies are idle for a first time, performing a first stage test on the dies, and setting multiple flags corresponding to the dies that fail the first stage test to a first logic level; after the dies are idle for a second time, performing a second stage test on the dies, and regarding the dies that pass the second stage test and have the corresponding flags set to the first logic level as suspected good dies and keeping the suspected good dies idle; and after the suspected good dies are idle for a third time, performing a third stage test on the suspected good dies.

20 Claims, 4 Drawing Sheets

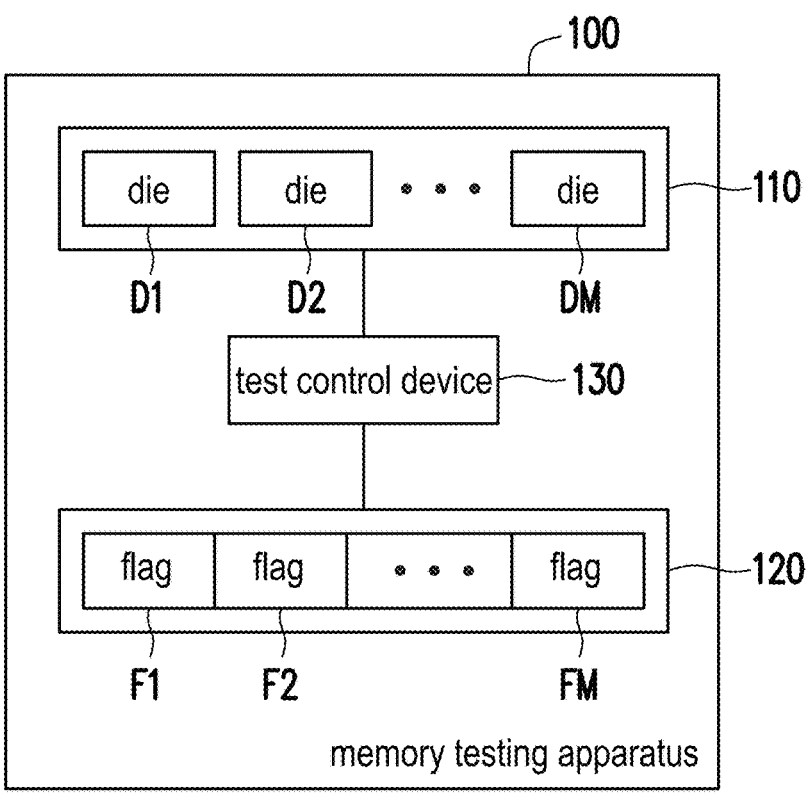

FIG. 1

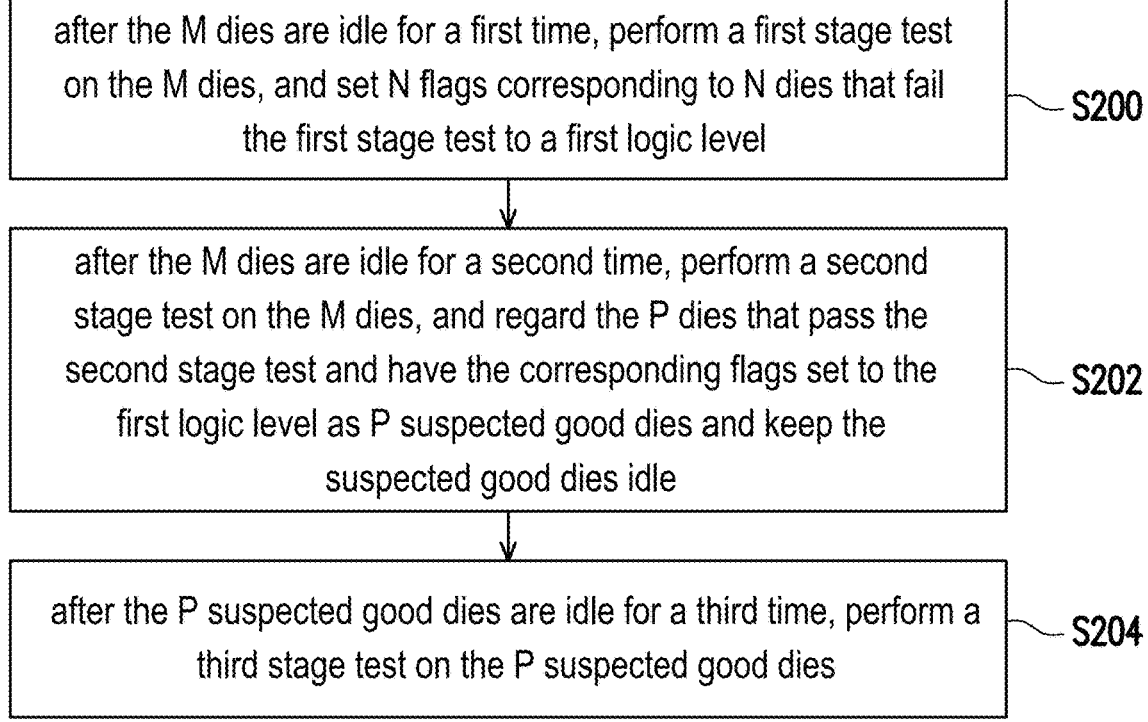

after the M dies are idle for a first time, perform a first stage test on the M dies, and set N flags corresponding to N dies that fail the first stage test to a first logic level — S200 after the M dies are idle for a second time, perform a second stage test on the M dies, and regard the P dies that pass the second stage test and have the corresponding flags set to the first logic level as P suspected good dies and keep the suspected good dies idle — S202 after the P suspected good dies are idle for a third time, perform a third stage test on the P suspected good dies — S204

FIG. 2

METHOD AND APPARATUS FOR MEMORY TESTING

CROSS-REFERENCE TO RELATED APPLICATION

This application claims the priority benefit of Taiwan application serial no. 113126074, filed on Jul. 11, 2024. The entirety of the above-mentioned patent application is hereby incorporated by reference herein and made a part of this specification.

BACKGROUND

Technical Field

The disclosure relates to a memory testing method, and in particular to a memory testing method and apparatus for testing low temperature data retention (LTDR).

Description of Related Art

The performance of LTDR is an important reliability item when conducting die testing on NOR flash memory. However, the LTDR is highly time-dependent. Currently, in practice, it is necessary to idle the die to be tested for a long waiting period (for example, more than 8,000 hours) in accordance with the specification requirements to test whether it passes the specification requirements. Due to lags and delays in the time for research and development and the product cycle, the cost for research and development increases.

SUMMARY

A memory testing method of the disclosure includes following steps: after multiple dies are idle for a first time, performing a first stage test on the dies, and setting multiple flags corresponding to the dies that fail the first stage test to a first logic level; after the dies are idle for a second time, performing a second stage test on the dies, and regarding the dies that pass the second stage test and have the corresponding flags set to the first logic level as multiple suspected good dies and keeping the suspected good dies idle; and after the suspected good dies are idle for a third time, performing a third stage test on the suspected good dies.

A memory testing apparatus of the disclosure includes a clamp, a storage device, and a test control device. The clamp is configured to hold the dies to be tested. The storage device is configured to store the flags respectively corresponding to the dies. The test control device is coupled to the clamp and the storage device. The test control device is configured to detect target memory cells corresponding to tail bits of each of the dies. After the dies are idle for the first time, the test control device performs the first stage test on the dies, and sets the flags corresponding to the dies that fail the first stage test to the first logic level. After the dies are idle for the second time, the test control device performs the second stage test on the dies, and regards the dies that pass the second stage test and have corresponding flags set to the first logic level as the suspected good dies and keeps the suspected good dies idle. After the suspected good dies are idle for the third time, the test control device performs the third stage test on the suspected good dies.

Based on the above, the method and apparatus for memory testing of the disclosure can quickly test whether the dies on the wafer may pass the specification requirements of LTDR in the relatively short period of time, shortening the time for research and development and the product cycle, thereby saving the cost for research and development.

BRIEF DESCRIPTION OF THE DRAWINGS

FIG. 1 is a block diagram of a memory testing apparatus according to an embodiment of the disclosure.

FIG. 2 is a flow chart of a memory testing method according to an embodiment of the disclosure.

DESCRIPTION OF THE EMBODIMENTS

Figure 3A:
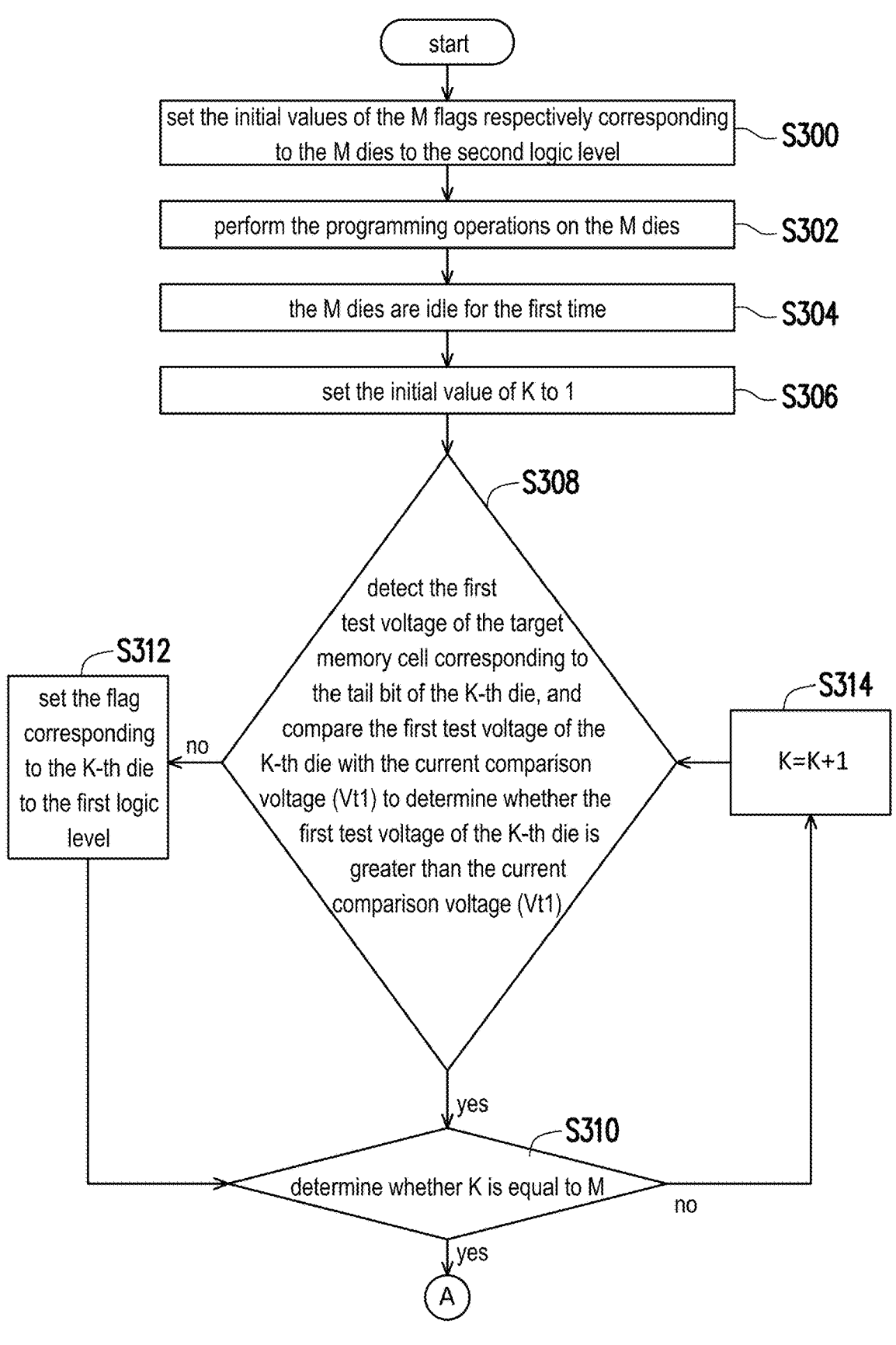
FIGS. 3A to 3C are flow charts of a memory testing method according to an embodiment of the disclosure.
Figure 3B:
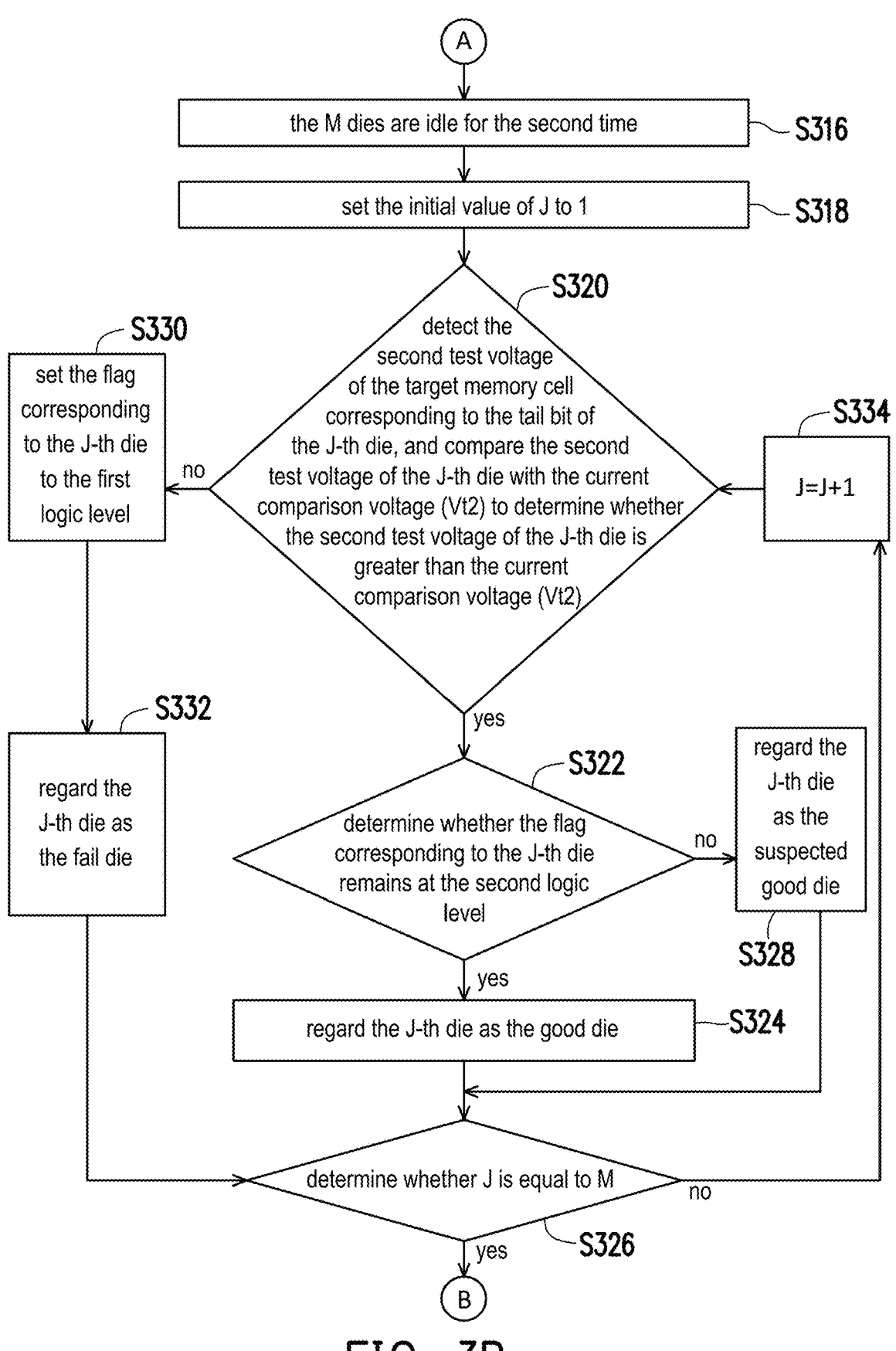

Referring to FIG. 1, a memory testing apparatus 100 of this embodiment may, for example, perform a test on M dies D1 to DM. The memory testing apparatus 100 includes a clamp 110, a storage device 120, and a test control device 130.

The clamp 110 may be used to clamp the M dies D1 to DM to be tested. For example, the clamp 110 may hold an entire wafer to test the M dies D1 to DM on the wafer.

The storage device 120 is, for example, any type of fixed or removable random access memory (RAM), read only memory (ROM), flash memory, hard disk or similar components or a combination of the above components, and may be used to store M flags F1 to FM corresponding to the M dies D1 to DM respectively. Each of the flags F1 to FM occupies, for example, 1 bit of storage space. M is a positive integer greater than 1.

The test control device 130 may be a central processing unit (CPU), a microprocessor, or be designed through a hardware description language (HDL) or any other digital circuit design method that is well known to those skilled in the art, and a hardware circuit implemented through field programmable logic gate arrays (FPGA), complex programmable logic devices (CPLD), or application special integrated circuits (ASIC). The test control device 130 is coupled to the clamp 110 and the storage device 120 and may be configured to detect a target memory cell corresponding to a tailing bit of each of the dies D1 to DM. It should be noted that the tail bits of each of the dies D1 to DM may be confirmed, for example, through the Gaussian distribution represented by threshold voltages of all memory cells in each of the dies D1 to DM. The test control device 130 may lock the target memory cells corresponding to the tail bits of each of the dies D1 to DM accordingly. In addition, in practical applications, when the tail bit of a specific die changes due to factors such as repair operations, the corresponding target memory cell also changes accordingly.

Referring to FIG. 1 and FIG. 2, a memory testing method of this embodiment is applicable to the memory testing apparatus 100 of FIG. 1. The steps of the memory testing method according to the embodiment of the disclosure will be described below in combination with various components in the memory testing apparatus 100.

In step S200, after the M dies D1 to DM are idle for a first time (for example, 168 hours), the test control device 130 performs a first stage test on the M dies D1 to DM, and set the N flags corresponding to the N dies that fail the first stage test to a first logic level. Specifically, before the first stage test begins, the test control device 130 performs programming operations on all memory cells (including the target memory cells) in each of the dies D1 to DM one by one, for example, in units of blocks. During the first stage test, the test control device 130 may detect a first test voltage of the target memory cells corresponding to the tail bits of each of the dies D1 to DM one by one. At this time, the test control device 130 may apply a read voltage to the target memory cells of each of the dies D1 to DM to detect the first test voltage according to a read current generated from the target memory cells. In this embodiment, "idle" refers to a state in which the die is placed stably in one place and does not perform any action during a performance test of LTDR.

Furthermore, the test control device 130 may compare the first test voltage of each of the dies D1 to DM with a current comparison voltage Vt1, so as to set the N flags corresponding to the N dies with the first test voltage being not greater than the current comparison voltage Vt1 to the first logic level. N is a positive integer greater than 1 and less than or equal to M. The first logic level is, for example, logic 0, but the disclosure is not limited thereto.

Next, in step S202, after the M dies D1 to DM are idle for a second time (for example, 332 hours), the test control device 130 performs a second stage test on the M dies D1 to DM, and regards the P dies that pass the second stage test and having the corresponding flags set to the first logic level as P suspected good dies and keep the suspected good dies idle. Specifically, during the second stage test, the test control device 130 may detect a second test voltage of the target memory cells corresponding to the tail bits of each of the dies D1 to DM one by one. At this time, the test control device 130 may apply the read voltage to the target memory cells of each of the dies D1 to DM to detect the second test voltage according to the read current generated from the target memory cells.

Furthermore, the test control device 130 may compare the second test voltage of each of the dies D1 to DM with a current comparison voltage Vt2, so as to regard the P dies with the second test voltage being greater than the current comparison voltage Vt2 and having the corresponding flag set to the first logical level as the P suspected good dies. At the same time, the test control device 130 may regard the dies with the second test voltage being greater than the current comparison voltage Vt2 and having the corresponding flag remains at the second logic level (not set to the first logic level) as good dies, and regard the dies with the second test voltage being not greater than the current comparison voltage Vt2 as fail dies. In other words, after the first stage test and the second stage test are completed, the test control device 130 may classify some of the dies D1 to DM into good dies and fail dies and no longer perform the test. Only the P suspected good dies that have not yet been determined to be good or fail are continue to be idle for a third stage test. P is a positive integer greater than 1 and less than or equal to N. The second logic level is, for example, logic 1, but the disclosure is not limited thereto.

Finally, in step S204, after the P suspected good dies are idle for a third time (for example, 500 hours), the third stage test is performed on the P suspected good dies. Specifically, during the third stage test, the test control device 130 may detect a third test voltage of the target memory cells corresponding to the tail bits of each of the suspected good dies one by one. At this time, the test control device 130 may apply the read voltage to the target memory cells of each of the suspected good dies to detect the third test voltage based on the read current generated from the target memory cells.

Furthermore, the test control device 130 may compare the third test voltage of each of the suspected good dies with a current comparison voltage Vt3, so as to regard the suspected good dies with the third test voltage being greater than the current comparison voltage Vt3 as the good dies. At the same time, the test control device 130 may regard the suspected good dies with third test voltage being not greater than the current comparison voltage Vt3 as the fail dies.

It should be noted that in this embodiment, the voltage value of the comparison voltage used during each of the stage tests (the first stage test, the second stage test, and the third stage test) is different. The comparison voltage is dynamically updated in response to an idle time of the die and a preset die failure rate. Specifically, testers may understand the mutual relationship between the comparison voltage, the idle time of the die, and the preset die failure rate of this embodiment based on a physical model of stress induced leakage current (SILC). For example, the relationship between the three may be expressed by the following formula:

$$BER \propto Time^A$$

$$\ln(BER) \propto B * Vt$$

$$Vt \propto C * \ln(Time)$$

$$Vt \propto D * \log(Time)$$

in which BER is the preset die failure rate, Time is the idle time of the die, and Vt is the comparison voltage. Based on the set required specifications, the testers may derive a voltage value of a comparison voltage currently used during each of the stage tests according to the preset die failure rate that is set as target and the idle time (the first time, the second time, and the third time) that is set during the test. A is, for example, a value between 1 and 2. B is, for example, a value between 3 and 4. C is, for example, a value between 0 and 1. D is, for example, a value between 0 and 1.

In this embodiment, the relationship between the comparison voltages Vt1, Vt2, and Vt3 used in each of the stage test is Vt1>Vt2>Vt3>Vread. In other words, the longer the idle time of the die, the less the comparison voltage is used. Vread is an initial test voltage obtained by testing the target memory cell before the die is idle, for example, 6 volts.

Through the above method, it is possible to quickly test whether the dies on the wafer the specification requirements for LTDR in a relatively short period of time, saving about 20 times more time, thereby shortening a time for research and development and a product cycle. In addition, the set of flags may be used to perform the additional third stage test on the suspected good dies that are temporally not determined to be good or fail to avoid misjudgments caused by unknown defect impact due to insufficient idle time.

The memory testing method of the disclosure is described in detail with another embodiment below. Referring to FIG. 1 and FIG. 3A to FIG. 3C, the memory testing method of this embodiment is applicable to the memory testing apparatus 100 of FIG. 1. The steps of the memory testing method according to the embodiment of the disclosure are described below in combination with various components in the memory testing apparatus 100.

In step S300, the test control device 130 sets the initial values of the M flags F1 to FM respectively corresponding to the M dies D1 to DM to the second logic level (e.g., logic 1).

Next, in step S302, the test control device 130 performs the programming operations on the M dies D1 to DM. Specifically, the test control device 130 may, for example, perform the programming operations on all memory cells (including the target memory cells) in each of the dies D1 to DM one by one in units of blocks.

Next, in step S304, the test control device 130 idles the M dies D1 to DM for the first time (for example, 168 hours). In step S306, the test control device 130 sets the initial value of K to 1 to perform the first stage test on the dies D1 to DM.

Next, in step S308, the test control device 130 detects the first test voltage of the target memory cell corresponding to the tail bit of the K-th die, and compares the first test voltage of the K-th die with the current comparison voltage Vt1 to determine whether the first test voltage of the K-th die is greater than the current comparison voltage Vt1. If 'yes', it means that the K-th die passes the first stage test, and the process proceeds directly to step S310. If 'no', it means that the K-th die fails the first stage test, so in step S312, the test control device 130 sets the flag corresponding to the K-th die to the first logic level (for example, logic 0), then proceeds to the step S310.

In the step S310, the test control device 130 determines whether K is equal to M. When K is not equal to M, it means that there are still dies among the dies D1 to DM that do not complete the first stage test. Therefore, in step S314, the test control device 130 increments K (K=K+1), and then returns to the step S308 to continue testing the next die.

When K equals M, it means that all the dies D1 to DM completes the first stage test, and thus proceeds to step S316 of FIG. 6B through a node A.

In the step S316, the test control device 130 idles the M dies D1 to DM for the second time (for example, 332 hours). In step S318, the test control device 130 sets the initial value of J to 1 to perform the second stage test on the dies D1 to DM.

Next, in step S320, the test control device 130 detects the second test voltage of the target memory cell corresponding to the tail bit of the J-th die, and compares the second test voltage of the J-th die with the current comparison voltage Vt2 to determine whether the second test voltage of the J-th die is greater than the current comparison voltage Vt2.

When the second test voltage of the J-th die is greater than the current comparison voltage Vt2, in step S322, the test control device 130 determines whether the flag corresponding to the J-th die remains at the second logic level. If 'yes', it means that the J-th die continuously passes the first stage test and the second stage test. Therefore, in step S324, the test control device 130 regards the J-th die as the good die, and then proceeds to step S326. If 'no', it means that the J-th die fails the first stage test but passes the second stage test. Therefore, in step S328, the test control device 130 regards the J-th die as the suspected good die and stores as an address of the J-th die of the suspected good die, and then proceeds to step S326.

On the other hand, when it is determined in the step S320 that the second test voltage of the J-th die is not greater than the current comparison voltage Vt2, it means that the J-th die fails the second stage test, so in step S330, the test control device 130 sets the flag corresponding to the J-th die to the first logic level, and in step S332, the test control device 130 regards the J-th die as the fail die, and then proceeds to step S326.

In step S326, the test control device 130 determines whether J is equal to M. When J is not equal to M, it means that there are still dies among the dies D1 to DM that do not complete the second stage test. Therefore, in step S334, the test control device 130 increments J (J=J+1), and then returns to the step S320 to continue testing the next die.

Figure 3C:
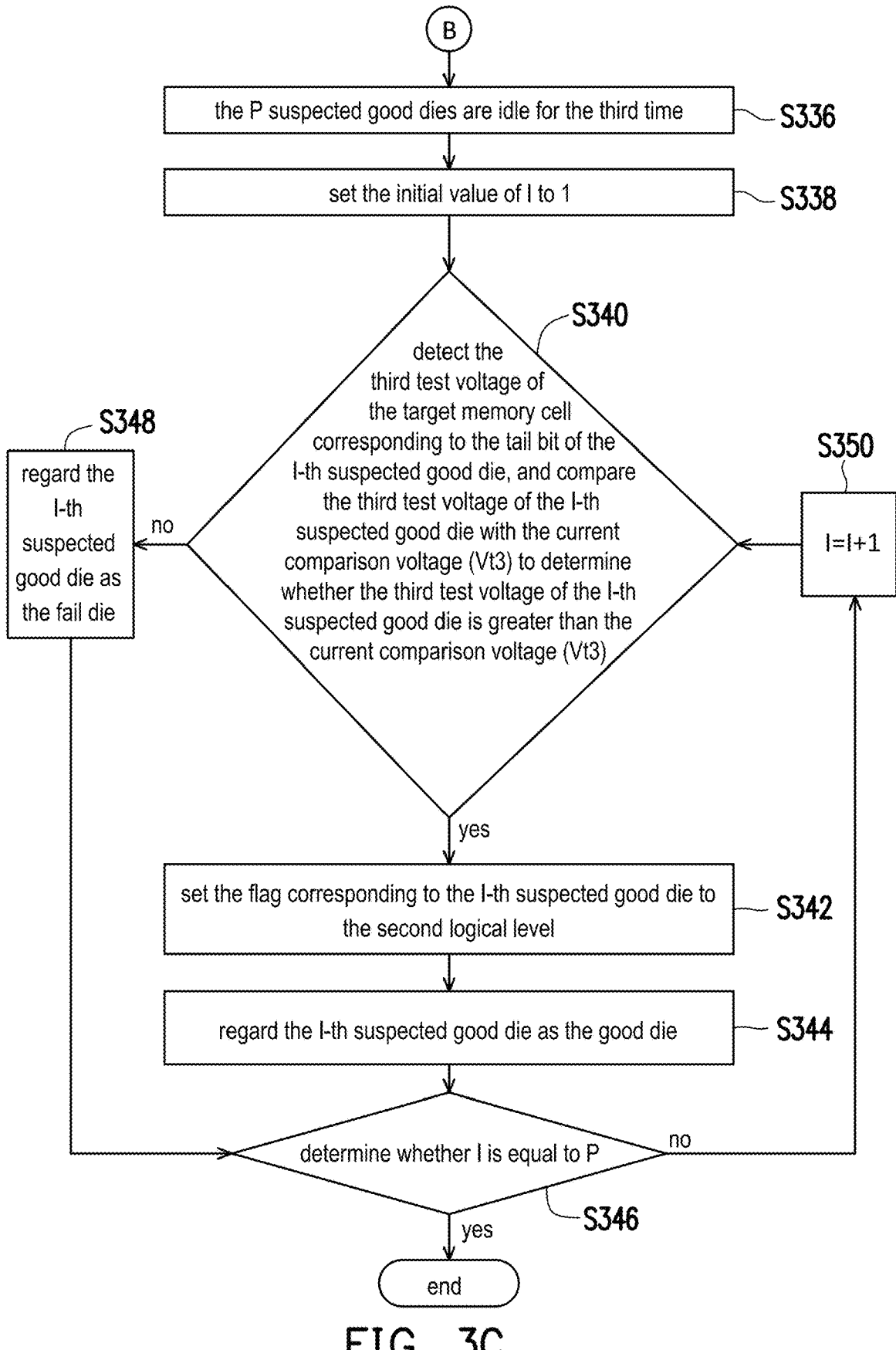

When J is equal to M, it means that all dies D1 to DM completes the second stage test, and thus proceeds to step S336 of FIG. 3C through a node B.

In step S336, the test control device 130 finds all (a total of P) suspected good dies according to the previously stored addresses of the suspected good dies, and idles the P suspected good dies for the third time (for example, 500 hours). In step S338, the test control device 130 sets the initial value of I to 1 to perform the third stage test on the P suspected good dies. In other words, after the first stage test and the second stage test are completed, the dies that are classified into the good die and the fail die among the dies D1 to DM are no longer be tested. The test control device 130 only performs the third stage test on the P suspected good dies that are not determined to be good or fail.

Next, in step S340, the test control device 130 detects the third test voltage of the target memory cell corresponding to the tail bit of the I-th suspected good die, and compares the third test voltage of the I-th suspected good die with the current comparison voltage Vt3 to determine whether the third test voltage of the I-th suspected good die is greater than the current comparison voltage Vt3. If 'yes', it means that the I-th suspected good die passes the third stage test. Therefore, in step S342, the test control device 130 sets the flag corresponding to the I-th suspected good die to the second logical level, and in step S344, the test control device 130 regards the I-th suspected good die as the good die, and then proceeds to step S346. If 'not', it means that the I-th suspected good die fails the third stage test, so in step S348, the I-th suspected good die is regarded as the fail die, and then proceeds to step S346.

In step S346, the test control device 130 determines whether I is equal to P. When I is not equal to P, it means that among the P suspected good dies, there are still suspected good dies that do not completed the third stage test. Therefore, in step S350, the test control device 130 increments I (I=I+1), and then returns to step the S340 to continue testing the next suspected good die.

When I equals P, it means that all suspected good dies completes the third stage test, and the memory testing method of this embodiment is completed.

In addition, after the first stage test, the second stage test, and the third stage test are completed, the flag corresponding to the die classified as the good die is set to the second logic level and the flag corresponding to the die classified as the fail die is set to the first logic level. Therefore, the test control device 130 may divide a number of flags set to the first logic level among the flags F1 to FM by a number of all flags to obtain an actual die failure rate. In this way, the time currently required to manually expand row data for analysis and judgment can be saved, and the accuracy can be increased.

To sum up, the method and apparatus for memory testing of the disclosure can quickly test whether the dies on the wafer may pass the specification requirements of LTDR in the relatively short period of time, shortening the time for research and development and the product cycle, thereby saving the cost for research and development. In addition, the method and apparatus for memory testing of the disclosure may also be used with the setting of flags to perform additional third stage test on the suspected good dies that are temporally not determined to be fail, so as to avoid the misjudgment occurred during testing the dies due to the insufficient idle time.

What is claimed is:

1. A memory testing method, comprising:
after a plurality of dies are idle for a first time, performing a first stage test on the plurality of dies, and setting a plurality of flags corresponding to the plurality of dies that fail the first stage test to a first logic level;
after the plurality of dies are idle for a second time, performing a second stage test on the plurality of dies, and regarding the plurality of dies that pass the second stage test and have the corresponding flags set to the first logic level as a plurality of suspected good dies and keeping the plurality of suspected good dies idle; and
after the plurality of suspected good dies are idle for a third time, performing a third stage test on the plurality of suspected good dies.

2. The memory testing method according to claim 1, wherein before performing the first stage test on the plurality of dies, the method further comprises:
setting an initial value of the plurality of flags respectively corresponding to the plurality of dies to a second logic level; and
performing a programming operation on the plurality of dies.

3. The memory testing method according to claim 1, wherein performing the first stage test on the plurality of dies, and setting the plurality of flags corresponding to the plurality of dies that fail the first stage test to the first logic level comprises:
during the first stage test, detecting a first test voltage of an target memory cell corresponding to a tail bit of each of the plurality of dies one by one, and comparing the first test voltage of each of the plurality of dies with a current comparison voltage; and
setting the plurality of flags corresponding to the plurality of dies with the first test voltage being not greater than the current comparison voltage to the first logic level.

4. The memory testing method according to claim 1, wherein performing the second stage test on the plurality of dies, and regarding the plurality of dies that pass the second stage test and have the corresponding flags set to the first logic level as the plurality of suspected good dies and keeping the plurality of suspected good dies idle comprises:
during the second stage of testing, detecting a second test voltage of a target memory cell corresponding to a tail bits of each of the plurality of dies one by one, and comparing the second test voltage of each of the plurality of dies with a current comparison voltage; and
regarding the plurality of dies with the second test voltage being greater than the current comparison voltage and having the corresponding flag set to the first logical level as the plurality of suspected good dies.

5. The memory testing method according to claim 4, further comprising:
setting the plurality of flags corresponding to the plurality of dies with the second test voltage being not greater than the current comparison voltage to the first logic level; and
regarding the plurality of dies with the second test voltage being not greater than the current comparison voltage as a plurality of fail dies.

6. The memory testing method according to claim 4, further comprising:
regarding the plurality of dies with the second test voltage being greater than the current comparison voltage and having the corresponding flag remain at a second logic level as a plurality of good dies.

7. The memory testing method according to claim 1, wherein performing the third stage test on the plurality of suspected good dies comprises:
during the third stage test, detecting a third test voltage of a target memory cell corresponding to a tail bit of each of the plurality of suspected good dies one by one, and comparing the third test voltage of each of the plurality of suspected good dies with a current comparison voltage;
setting the plurality of flags corresponding to the plurality of suspected good dies with the third test voltage being greater than the current comparison voltage to a second logic level; and
regarding the plurality of suspected good dies with the third test voltage being greater than the current comparison voltage as a plurality of good dies.

8. The memory testing method according to claim 7, wherein performing the third stage test on the plurality of suspected good dies comprises:
regarding the plurality of suspected good dies with the third test voltage being not greater than the current comparison voltage as a plurality of fail dies.

9. The memory testing method according to claim 1, wherein a voltage value of a comparison voltage used during the first stage test, the second stage test, and the third stage test is different, and the comparison voltage is dynamically updated in response to an idle time of the plurality of dies and a preset die failure rate.

10. The memory testing method according to claim 1, further comprising:
after the first stage test, the second stage test, and the third stage test are completed, dividing a number of the plurality of flags set to the first logic level by a number of all of the plurality of flags to obtain an actual die failure rate.

11. A memory testing apparatus, comprising:
a clamp, configured to hold a plurality of dies to be tested;
a storage device, configured to store a plurality of flags respectively corresponding to the plurality of dies; and
a test control device, coupled to the clamp and the storage device, configured to detect a target memory cell corresponding to a tail bit of each of the plurality of dies,
wherein, after the plurality of dies are idle for a first time, the test control device performs a first stage test on the plurality of dies, and sets the plurality of flags corresponding to the plurality of dies that fail the first stage test to a first logic level,
after the plurality of dies are idle for a second time, the test control device performs a second stage test on the plurality of dies, and regards the plurality of dies that pass the second stage test and have the corresponding plurality of flags set to the first logical level as a plurality of suspected good dies and keeps the plurality of suspected good dies idle,
after the plurality of suspected good dies are idle for a third time, the test control device performs a third stage test on the plurality of suspected good dies.

12. The memory testing apparatus according to claim 11, wherein before performing the first stage test on the plurality of dies, the test control device sets an initial value of the plurality of flags respectively corresponding to the plurality of dies to a second logic level, and performs a programming operation on the plurality of dies.

13. The memory testing apparatus according to claim 11, wherein during the first stage test, the test control device detects a first test voltage of the target memory cell of each of the plurality of dies one by one, and compares the first test voltage of each of the plurality of dies with a current comparison voltage to set the plurality of flags corresponding to the plurality of dies with the first test voltage being not greater than the current comparison voltage to the first logic level.

14. The memory testing apparatus according to claim 11, wherein during the second stage test, the test control device detects a second test voltage of the target memory cell of each of the plurality of dies one by one, and compares the second test voltage of each of the plurality of dies with a current comparison voltage so as to regard the plurality of dies with second test voltage being greater than the current comparison voltage and having the corresponding plurality of flags set to the first logic level as the plurality of suspected good dies.

15. The memory testing apparatus according to claim 14, wherein the test control device sets the plurality of flags corresponding to the plurality of dies with the second test voltage being not greater than the current comparison voltage to the first logic level, and regards the plurality of dies with the second test voltage being not greater than the current comparison voltage as a plurality of fail dies.

16. The memory test apparatus according to claim 14, wherein the test control device regards the plurality of dies with the second test voltage being greater than the current comparison voltage and having the corresponding plurality of flags remain at a second logic level as a plurality of good dies.

17. The memory testing apparatus according to claim 11, wherein during the third stage testing, the test control device detects a third test voltage of the target memory cell of each of the plurality of suspected good dies one by one, and compares the third test voltage of each of the plurality of suspected good dies with a current comparison voltage to set the plurality of flags corresponding to the plurality of suspected good dies with the third test voltage being greater than the current comparison voltage to a second logic level, and regards the plurality of suspected good des with the third test voltage being greater than the current comparison voltage as a plurality of good dies.

18. The memory testing apparatus according to claim 17, wherein the test control device regards the plurality of suspected good dies with the third test voltage being not greater than the current comparison voltage as a plurality of fail dies.

19. The memory testing apparatus according to claim 11, wherein a voltage value of a comparison voltage used during the first stage test, the second stage test, and the third stage test is different, and the comparison voltage is dynamically updated in response to an idle time of the plurality of dies and a preset die failure rate.

20. The memory testing apparatus according to claim 11, wherein after the first stage test, the second stage test, and the third stage test are completed, the test control device divides a number of the plurality of flags set to the first logic level by a number of all of the plurality of flags to obtain an actual die failure rate.

\* \* \* \* \*